US008967322B2

(12) United States Patent
Zhang

(10) Patent No.: US 8,967,322 B2

(45) Date of Patent: Mar. 3, 2015

(54) SPEAKER BOX

(71) Applicant: Xiong Zhang, Shenzhen (CN)

(72) Inventor: Xiong Zhang, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 0 days.

(21) Appl. No.: 14/064,466

(22) Filed: Oct. 28, 2013

(65) Prior Publication Data

US 2014/0116800 A1 May 1, 2014

(30) Foreign Application Priority Data

Oct. 29, 2012 (CN) ...................... 2012 2 0561654 U

(51) Int. Cl.

| | |
|---|---|
| ***H05K 5/02*** | (2006.01) |
| ***H04R 1/28*** | (2006.01) |
| ***H04R 1/02*** | (2006.01) |
| *H05K 5/00* | (2006.01) |
| *H04R 1/00* | (2006.01) |

(52) U.S. Cl.

CPC ...................................... *H04R 1/025* (2013.01)

USPC ............................ 181/199; 181/148; 381/345

(58) Field of Classification Search

CPC ......... H05K 5/00; H05K 5/0091; H05K 5/02; H05K 5/0217; H04R 1/00; H04R 1/02; H04R 1/021; H04R 1/2803; H04R 1/2807; H04R 1/2811

USPC .................................. 181/199, 148; 381/345

See application file for complete search history.

(56) References Cited

U.S. PATENT DOCUMENTS

| | | | | |
|---|---|---|---|---|
| 7,236,374 | B2 * | 6/2007 | Hirao | 361/825 |
| 7,742,791 | B2 * | 6/2010 | Shiogama | 455/575.1 |
| 7,950,962 | B2 * | 5/2011 | Mase et al. | 439/587 |
| 8,297,142 | B2 * | 10/2012 | Kawada et al. | 74/473.12 |
| 8,444,199 | B2 * | 5/2013 | Takeuchi et al. | 296/37.8 |
| 8,615,101 | B2 * | 12/2013 | Zhang et al. | 381/412 |
| 8,643,690 | B2 * | 2/2014 | Takagi | 347/263 |
| 2001/0052521 | A1 * | 12/2001 | Goyal et al. | 220/4.21 |
| 2008/0192976 | A1 * | 8/2008 | Kim | 381/412 |
| 2010/0097749 | A1 * | 4/2010 | Kaneko et al. | 361/679.21 |
| 2013/0259289 | A1 * | 10/2013 | Zhang et al. | 381/412 |

* cited by examiner

*Primary Examiner* — Edgardo San Martin

(74) *Attorney, Agent, or Firm* — IPro, Inc.; Na Xu

(57) ABSTRACT

The present disclosure provides a speaker box including a main body portion and an upper plate connected to the main body portion. The main body portion includes a frame for receiving a speaker body therein. The frame has a cavity for housing the speaker body, a partition wall, and a groove separated from the cavity by the partition wall for preventing the frame from shrinking. A plurality of reinforcement ribs spaced from each other is disposed on an inner side wall opposite to the partition wall.

4 Claims, 3 Drawing Sheets

SPEAKER BOX

FIELD OF THE INVENTION

The present disclosure generally relates to the art of transducers, and more particularly, to a speaker box capable of providing sound.

DESCRIPTION OF RELATED ART

Gradually, speaker boxes are widely used in many types of portable electronic devices, such as mobile phones, notebook computers, hearing aids, for converting audio electrical signals to audible sounds.

Speaker box is an electronic element of audio equipment in common use capable of playing audio signal, and a frame of a traditional speaker box is manufactured by injection molding process, thus, all of the traditional speaker boxes have a groove for preventing the box from shrinking. However, if the inner wall of the groove is too thick, it will cause shrinking problem. If the inner wall of the groove is too thin, it will affect the reliability of the speaker box.

Therefore, the present disclosure is provided to solve the problems mentioned above.

DETAILED DESCRIPTION OF THE EXEMPLARY EMBODIMENT

Reference will now be made to describe an exemplary embodiment of the present disclosure in detail.

Figure 1:
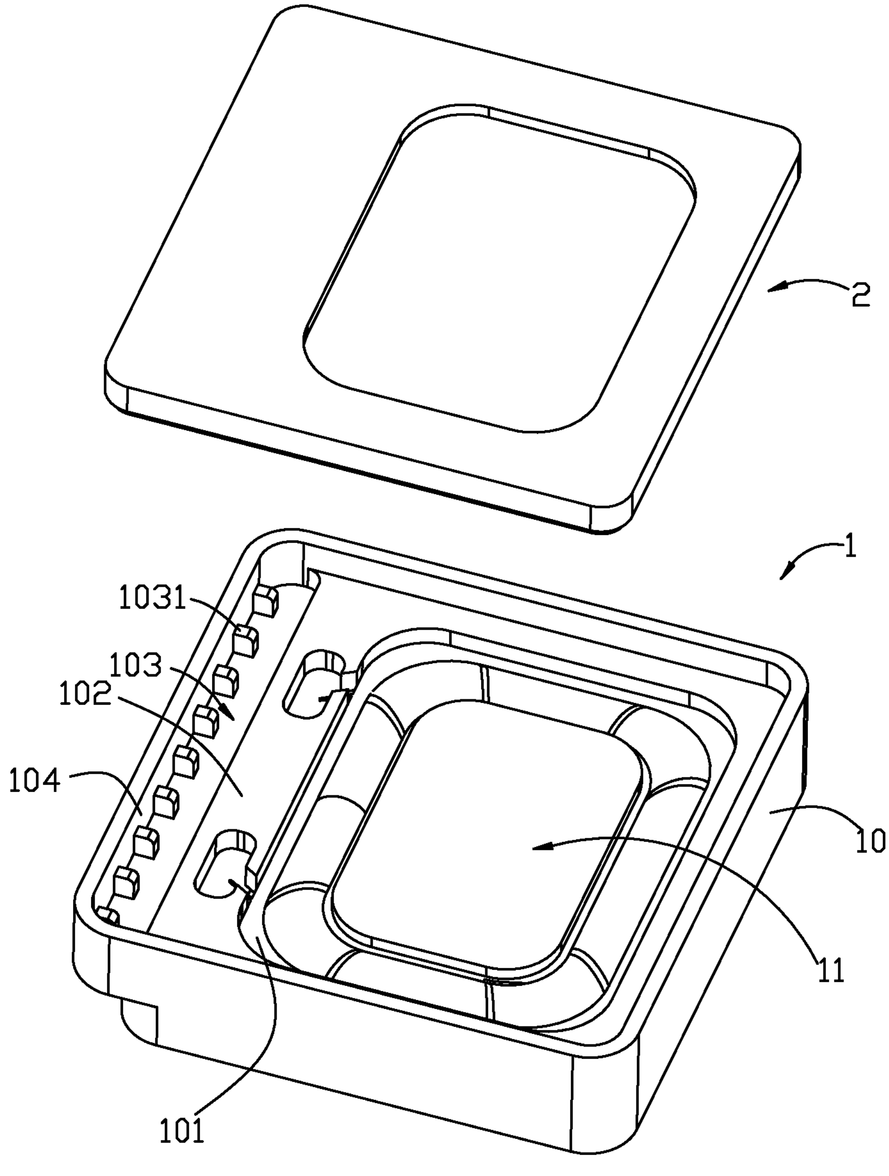
FIG. 1 is an isometric exploded view of a speaker box in accordance with an exemplary embodiment of the present disclosure.
Figure 2:
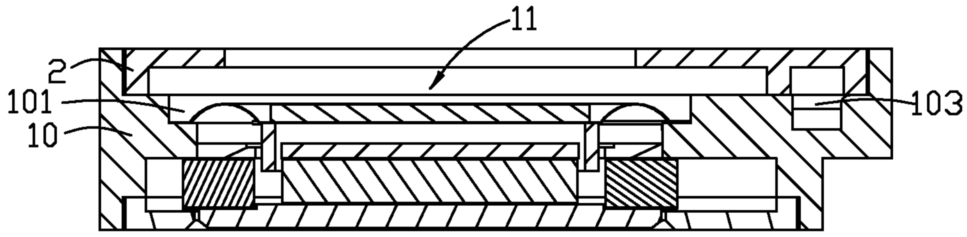
FIG. 2 is an illustrative cross-sectional view of the speaker box in FIG. 1.
Figure 3:
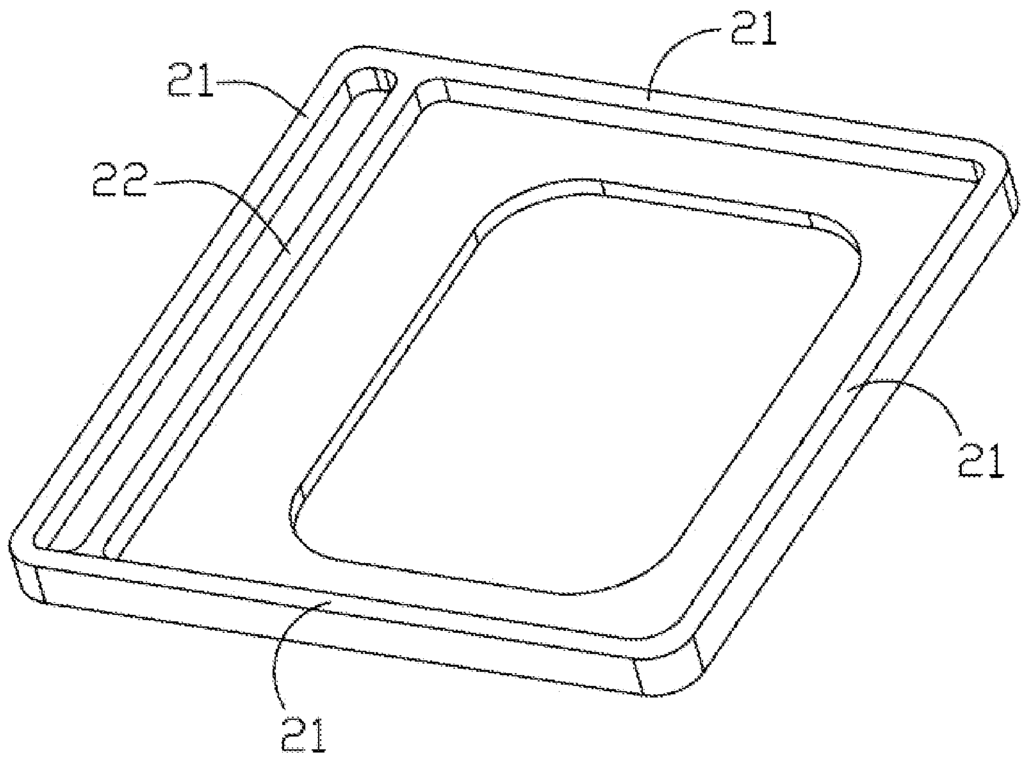
FIG. 3 is an isometric view of an upper plate of the speaker box in FIG. 1.

Referring to FIGS. 1-3, the present disclosure provides a speaker box, which comprises a main body portion 1 and an upper plate 2 connected to the main body portion 1. The main body portion 1 has a frame 10 and a speaker body 11 received therein. The frame 10 has a cavity 101 for housing the speaker body 11, a partition wall 102, and a groove 103 separated from the cavity 101 by the partition wall 102 for preventing the frame 10 from shrinking.

A plurality of the reinforcement ribs 1031 spaced from each other is disposed on an inner side wall 104 opposite to the partition wall 102, and the inner side wall 104 is spaced from the partition wall 102. The reinforcement ribs 1031 are fixed to a bottom of the groove 103. In fact, the inner side wall 104 and the bottom of the groove 103 are integrated with the reinforcement ribs 1031, and the reinforcement ribs 1031 are optionally such arranged that each of the reinforcement ribs 1031 keeps a determined distance to an adjacent one. The upper plate 2 is fixed to the reinforcement ribs 1031. A surface of a combination of the reinforcement ribs 1031 facing the upper plate 2 and a surface of the partition wall 102 facing the upper plate 2 are on a same plane. The reinforcement ribs 1031 can optionally be disposed at the inner side wall of the groove 103 opposite to the partition wall 102, and can also optionally be disposed at any inner wall of the groove 103.

The upper plate 2 includes four protruding ribs 21 connected with each other and a partition plate 22 connected with two opposite protruding ribs 21. The protruding ribs 21 extending downwardly from a periphery of the upper plate 2 are fixed to the reinforcement ribs 1031. The partition plate 22 is fixed to the partition wall 102. The upper plate 2 is fixed to the main body portion 1 by ultrasonic soldering, glue, or laser soldering, at a result, the groove 103 forms a closure chamber. The present disclosure improves the bonding strength of the upper plate 2 and the main body portion 1, the stability of the speaker box. Furthermore, the disclosure can present the frame 10 of the speaker box from shrinking.

While the present disclosure has been described with reference to the specific embodiments, the description of the disclosure is illustrative and is not to be construed as limiting the disclosure. Various of modifications to the present disclosure can be made to the exemplary embodiments by those skilled in the art without departing from the true spirit and scope of the disclosure as defined by the appended claims.

What is claimed is:

1. A speaker box comprising:

a main body portion, including a frame and a speaker body received therein, wherein the frame has a cavity for housing the speaker body, a partition wall, and a groove separated from the cavity by the partition wall for preventing the frame from shrinking;

a plurality of reinforcement ribs spaced from each other is disposed on an inner side wall opposite to the partition wall, wherein the reinforcement ribs are spaced from the partition wall; and an upper plate, connecting with the main body portion and fixed to the reinforcement ribs.

2. The speaker box as described in claim 1, wherein a surface of a combination of the reinforcement ribs facing the upper plate and a surface of the partition wall facing the upper plate are on a same plate.

3. The speaker box as described in claim 1, wherein the reinforcement ribs are fixed to a bottom of the groove.

4. The speaker box as described in claim 1, wherein the upper plate includes four protruding ribs connected with each other and a partition plate connected with two opposite protruding ribs, and the protruding ribs extending downwardly from a periphery of the upper plate are fixed to the reinforcement ribs, and the partition plate is fixed to the partition wall.

* * * * *